United States Patent
Kakimoto

(10) Patent No.: US 10,110,219 B2
(45) Date of Patent: Oct. 23, 2018

(54) DRIVING APPARATUS

(71) Applicant: DENSO CORPORATION, Kariya, Aichi-pref. (JP)

(72) Inventor: Noriyuki Kakimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/572,640

(22) PCT Filed: May 18, 2016

(86) PCT No.: PCT/JP2016/002422
§ 371 (c)(1),
(2) Date: Nov. 8, 2017

(87) PCT Pub. No.: WO2016/189830
PCT Pub. Date: Dec. 1, 2016

(65) Prior Publication Data
US 2018/0138905 A1    May 17, 2018

(30) Foreign Application Priority Data
May 27, 2015 (JP) ................. 2015-107449

(51) Int. Cl.
*H03B 1/00* (2006.01)
*H03K 3/00* (2006.01)
(Continued)

(52) U.S. Cl.
CPC ....... *H03K 17/567* (2013.01); *G01R 19/0092* (2013.01); *G01R 31/44* (2013.01);
(Continued)

(58) Field of Classification Search
CPC ..... H03K 17/567; H03K 5/08; G01R 19/0092
(Continued)

(56) References Cited

U.S. PATENT DOCUMENTS 5,500,619 A * 3/1996 Miyasaka ........ H03K 17/08128
                                                            327/427
5,559,656 A * 9/1996 Chokhawala ....... H01L 27/0248
                                                            361/111
(Continued)

FOREIGN PATENT DOCUMENTS

| JP | H05-021723 A | 1/1993 |
|---|---|---|
| JP | H05-090933 A | 4/1993 |
| JP | H10-032476 A | 2/1998 |
| JP | 2002-165439 A | 6/2002 |
| JP | 2009-142070 A | 6/2009 |
| JP | 2009-195024 A | 8/2009 |
| JP | 2014-143878 A | 8/2014 |

*Primary Examiner* — Thomas Skibinski
(74) *Attorney, Agent, or Firm* — Posz Law Group, PLC

(57) ABSTRACT

A driving apparatus configured to drive a plurality of switching elements including a first switching element and a second switching element, and each of the plurality of switching elements has a gate electrode. The driving apparatus includes: a driving circuit configured to supply a voltage to the gate electrode; and a controller configured to control the plurality of switching elements to turn on or off. The controller includes a control mode having a multi-driving mode configured to drive both of the first switching element and the second switching element, and a single driving mode configured to drive only the first switching element. The controller at the single driving mode sets a gate voltage to be applied to a gate electrode of the first switching element at a clamping voltage, which is smaller than the gate voltage of the first switching element at the multi-driving mode.

7 Claims, 3 Drawing Sheets

(51) Int. Cl.
*H03K 17/567* (2006.01)
*H02M 1/08* (2006.01)
*H03K 17/56* (2006.01)
*G01R 19/00* (2006.01)
*H03K 5/08* (2006.01)
*G01R 31/44* (2006.01)
*G01R 31/26* (2014.01)

(52) U.S. Cl.
CPC ............... *H02M 1/08* (2013.01); *H03K 5/08* (2013.01); *H03K 17/56* (2013.01); *G01R 31/2608* (2013.01)

(58) Field of Classification Search
USPC ........ 327/108–112, 427, 434, 437, 374–377; 326/82, 83, 87
See application file for complete search history.

(56) References Cited

U.S. PATENT DOCUMENTS

| | | | |
|---|---|---|---|
| 2004/0252435 A1 | 12/2004 | Ishikawa et al. | |
| 2007/0030615 A1 | 2/2007 | Ishikawa et al. | |
| 2009/0128974 A1 | 5/2009 | Ishikawa et al. | |
| 2012/0057387 A1* | 3/2012 | Lai ........................ | H02M 7/797 363/132 |
| 2012/0280728 A1* | 11/2012 | Hussein ............... | H03K 17/127 327/155 |
| 2013/0062626 A1* | 3/2013 | Takao .................. | H03K 17/127 257/77 |
| 2013/0155745 A1* | 6/2013 | Tanaka ................. | H02M 7/003 363/131 |
| 2014/0184303 A1* | 7/2014 | Hasegawa ............. | H03K 17/12 327/377 |

* cited by examiner

DRIVING APPARATUS

CROSS REFERENCE TO RELATED APPLICATIONS

This application is a U.S. national stage of International Patent Application No. PCT/JP2016/002422 filed on May 18, 2016 and is based on Japanese Patent Application No. 2015-107449 filed on May 27, 2015, the disclosures of which are incorporated herein by reference.

TECHNICAL FIELD

The present disclosure relates to a driving apparatus that drives a plurality of switching elements connected in parallel.

BACKGROUND ART

The collective type switching circuit described in Patent Literature 1 is a circuit driving a MOSFET and an IGBT, which are connected in parallel. The IGBT causes a switching loss because a tail current is generated when the IGBT is turned off. Accordingly, the collective type switching circuit in Patent Literature 1 still drives the MOSFET within a certain period from a moment when the IGBT is turned off, and then drives the MOSFET to turn off lastly.

Recently, a semiconductor with silicon carbide as a main component has been practically used. The SiC has relatively higher dielectric breakdown electric field strength as compared to silicon, a semiconductor such as a MOSFET can be made slimmer so that a lower on-resistance can be achieved as a result and high speed in switching can also be achieved. However, the SiC is relatively more expensive than the silicon, so it is required to miniaturize a semiconductor element with the use of SiC for cost reduction.

The collective type switching element described in Patent Literature 1 has to prevent the element breakdown caused by a large current such as a short current since there is a period in which the MOSFET is only driven. For example, it is required to provide a countermeasure such as stopping a voltage supply to the MOSFET in a situation where the output current of the MOSFET is over a threshold value. Accordingly, it is required to provide a device for detecting a value of the output current. However, in a case where the SiC is used as the configuration element for MOSFET, a device for detecting current has to be arranged as the SiC element as described above. In other words, the element grows in size and it is opposite to the requirement for miniaturizing the element.

PRIOR ART LITERATURES

Patent Literature

Patent Literature 1: JP H5-90933 A

SUMMARY OF INVENTION

It is an object of the present disclosure to provide a driving apparatus that miniaturizes a semiconductor device including a plurality of switching elements, the plurality of switching elements driven in parallel connection.

A driving apparatus according to an aspect of the present disclosure is configured to drive a plurality of switching elements including a first switching element and a second switching element, and each of the plurality of switching elements has a gate electrode. The driving apparatus includes: a driving circuit configured to supply a voltage to the gate electrode; and a controller configured to control the plurality of switching elements to turn on or off. The controller includes a control mode having a multi-driving mode configured to drive both of the first switching element and the second switching element, and a single driving mode configured to drive only the first switching element. The controller at the single driving mode sets a gate voltage to be applied to a gate electrode of the first switching element at a clamping voltage, which is smaller than the gate voltage of the first switching element at the multi-driving mode.

Since the gate voltage at the single driving mode is set at the clamping voltage, the gate voltage can be set smaller than the voltage at the multi-driving mode. Accordingly, even when the short circuit occurs in the load and the overcurrent flows through the load, the short circuit current flowing through the first switching element can be inhibited so that the short circuit capacity can be elongated. In other words, timely delay for carrying out the short circuit protection can be ensured; therefore, the output current at the first switching element may not have to be detected early. Accordingly, a measure for preventing the short circuit in the switching element can be carried out without providing a device for current detection at the output current path of the first switching element. Accordingly, the part of omitting the current detector for the first switching element benefits in reducing the size of the first switching element or the size of the switching element.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
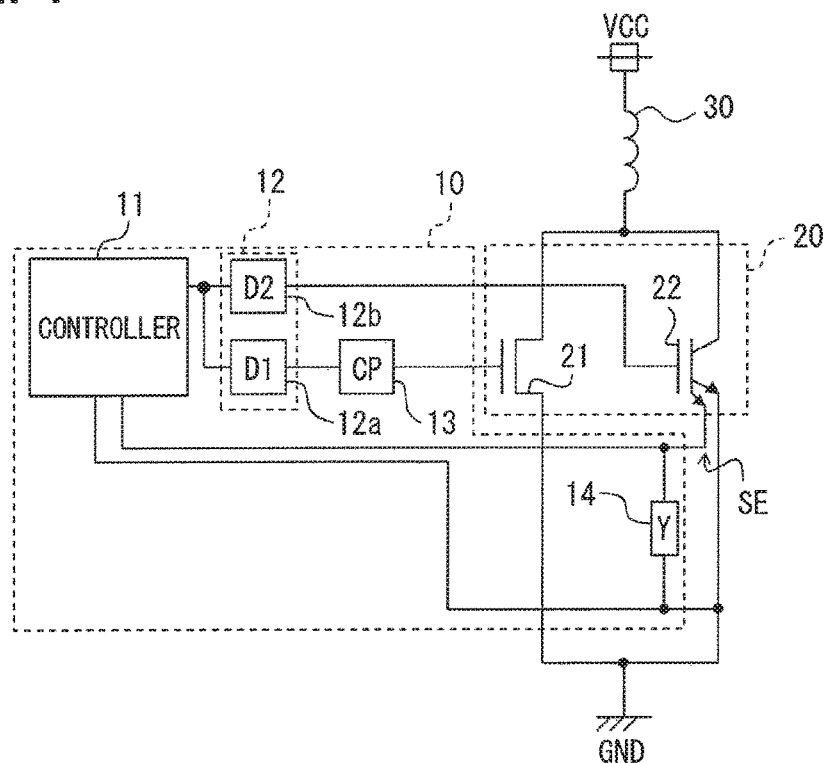
FIG. 1 is a circuitry diagram that shows a general configuration of a driving apparatus and a periphery apparatus of the driving apparatus according to a first embodiment.

The following describes embodiments according to the present disclosure with reference to drawings. It is noted that the identical parts or equivalents parts in the following drawings are appended by the same reference numerals.

First Embodiment

Firstly, a general configuration of a driving apparatus according to the present embodiment is described with reference to FIG. 1.

A driving apparatus according to the present embodiment, for example, is used in a semiconductor device for getting output current by connecting two switching elements of a MOSFET and an IGBT in parallel. The IGBT has a property that generates a tail current when the IGBT is turned off. The tail current causes the switching loss when the IGBT is turned off. However, in the semiconductor device in which the MOSFET and the IGBT are connected in parallel, the power consumption caused by the tail current can be inhibited by delaying the off-timing of the MOSFET later than the off-timing of the IGBT.

As illustrated in FIG. 1, a driving apparatus 10 is driven by supplying a gate voltage to the gate electrode of the MOSFET 21 and the gate electrode of the IGBT 22, which are connected in parallel between a main power supply VCC and a ground GND. In the following, the combination of the MOSFET 21 and the IGBT 22 is called a switching element 20. It is noted that the MOSFET 21 and the IGBT 22 respectively correspond to a first switching element and a second switching element.

The load 30 is connected to the switching element 20 in series between the main power supply VCC and the ground GND. It is configured that a current is supplied to the load 30 according to a situation where the output current flows after the moment where the switching element 20 is turned on.

Figure 4:
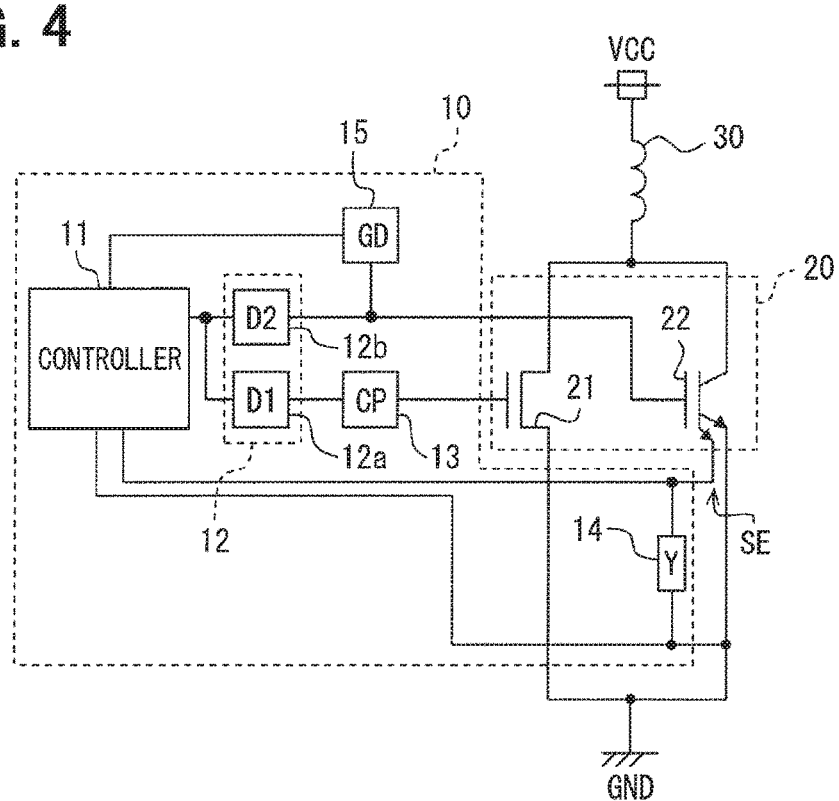
FIG. 4 is a circuitry diagram that shows a general configuration of a driving apparatus and a periphery apparatus of the driving apparatus according to a second embodiment.

The driving apparatus 10 includes a controller 11, a driver 12, a clamping circuit 13 (denoted as CP in FIGS. 1 and 4), and a shunt resistor 14 (denoted as Y in FIGS. 1 and 4).

The controller 11 outputs a control signal to the driving circuit 12, and controls the switching element 20 to turn on or off through the driving circuit 12. The controller 11 outputs a control signal based on, for example, an operation state of the load 30, the output current or temperature of the switching element 20 and a command from an external device. For example, the controller 11 according to the present embodiment monitors a voltage across both ends of the shunt resistor 14, and protects a switching element 20 by stopping the operation of the driving circuit 12 when the value of the output current flowing through the shunt resistor 14 exceeds a threshold value.

In addition, the controller 11 has a multi-driving mode and a single driving mode as the control mode of the switching element 20. The multi-driving mode is a control mode in which the controller 11 supplies a gate voltage to the gate electrode of each of the MOSFET 21 and the IGBT 22 through the driving circuit 12 in order to generate output current. The single driving mode is a control mode in which the controller 11 supplies a gate voltage to only the gate electrode of the MOSFET 21 through the driving circuit 12.

The driving circuit 12 supplies a gate voltage to the gate electrode of the switching element 20 based on a received control signal, which is outputted from the controller 11. The driving circuit 12 includes: the first switching element, in other words, a first driving circuit 12a (denoted as D1 in FIGS. 1 and 4) supplying a gate voltage to the MOSFET 21; and the second switching element, in other words, a second driving circuit 12b (denoted as D2 in FIGS. 1 and 4) supplying a gate voltage to the IGBT 22. The first driving circuit 12a controls the MOSFET 21 to turn on or off by applying or stopping the supply of gate voltage in a predetermined period based on a control signal outputted from the controller 11. In addition, the second driving circuit 12b controls the IGBT 22 to turn on or off by applying or stopping the supply of gate voltage in a predetermined period based on a control signal outputted from the controller 11.

The clamping circuit 13 is interposed between the first driving circuit 12a and the MOSFET 21. The clamping circuit 13 clamps the gate voltage supplied to the MOSFET 21 from the first driving circuit 12a at a clamping voltage as a predetermined upper limit value. In other words, the clamping circuit 13 lowers a voltage outputted from the first driving circuit 12a and converts to a gate voltage of the MOSFET 21.

The voltage dropping performed by the clamping circuit 13 is effective under a predetermined condition. In particular, when the controller 11 drives the driving circuit 12 at the single driving mode as the control mode, the clamping circuit 13 is configured to lower the outputted gate voltage to the clamping voltage.

The shunt resistor 14 is arranged between the sense emitter terminal SE of the IGBT 22 and the ground GND as shown in FIG. 1. Subsequently, the controller 11 monitors the output current of the IGBT 22 as the output current of the switching element 20. In particular, the controller 11 detects a voltage across both ends of the shunt resistor 14 and detects a value of the current flowing through the shunt resistor 14 based on a known resistance value of the shunt resistor 14. The shunt resistor 14 corresponds to a current detector. It is noted that, in the present embodiment, the current path of the output current has a path through the MOSFET 21 and a path through the IGBT 22; however, the shunt resistor 14 as the current detector is provided at one of the two output current paths at the IGBT 22 side.

Figure 2:
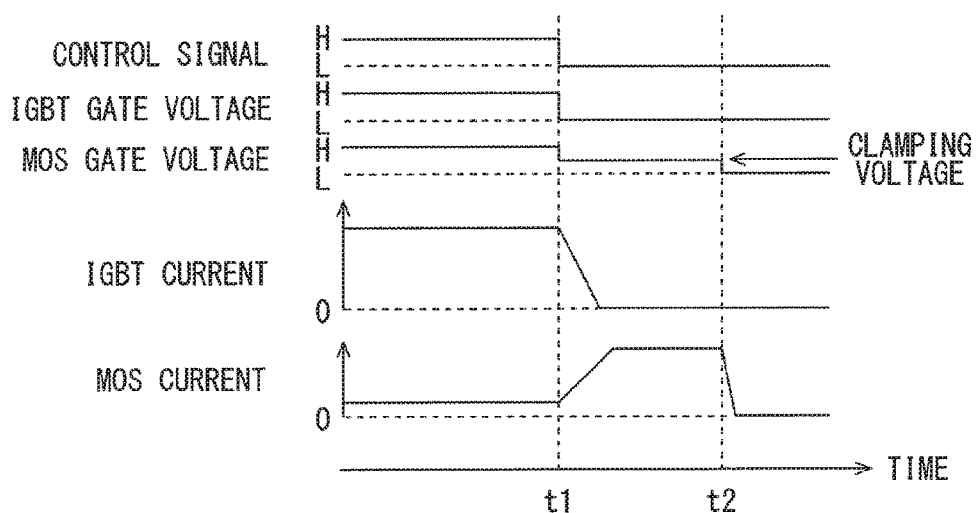
FIG. 2 is a timing chart that shows an operation of the driving apparatus in a situation where a short circuit does not occur.

Next, the operation and its effect of the driving apparatus 10 are described with reference to FIGS. 2 and 3.

Firstly, the operation in a regular state in which a short circuit does not occur in the load 30 is described with reference to FIG. 2. Prior to time t1, the control signal outputted from the controller 11 is at a High level (hereinafter referred to as an H-level), the controller 11 controls the first driving circuit 12a and the second driver 12b so as to apply an ordinary gate voltage to any one of the gate electrode of the MOSFET 21 and the gate electrode of the IGBT 22. That is, prior to time t1, the MOSFET 21 and the IGBT 22 are at a full-on state, and the control mode of the controller 11 is at the multi-driving mode.

At time t1, the controller 11 switches the control signal from the H-level to a Low level (hereinafter referred to as an L-level) to turn off the switching element 20. Accordingly, the second driving circuit 12b stops the supply of the gate voltage to the IGBT 22.

On the other hands, the controller 11 continues the driving of the first driving circuit 12a until the time t2 even when the control signal is switched from the H-level to the L-level, and continues to apply a gate voltage to the MOSFET 21. In this situation, the controller 11 sets the clamping of the gate voltage performed by the clamping circuit 13 to be effective. Accordingly, the gate voltage supplied to the MOSFET 21 becomes the clamping voltage lowered from the gate voltage at the time of having the multi-driving mode. Subsequently, at time t2, the controller 11 controls the first driving circuit 12a to stop the supply of the gate voltage to the MOSFET 21. Accordingly, the MOSFET 21 at time t2 is at an off state.

With regard to the multi-driving mode prior to time t1, the IGBT 22 is in charge of the large portion of the output current in the switching element 20. On the other hands, when the multi-driving mode is switched to the single driving mode, the output current of the IGBT 22 becomes zero. Thus, a large current flows through the MOSFET 21.

In a period from time t1 to time t2, the IGBT 22 is at the on state, and the MOSFET 21 is at the single driving mode at the off state. That is, the driving apparatus 10 operates to stop the switching element 20 through the switching from the multi-driving mode to the single driving mode when the switching element 20 is turned off.

The duration time (t2−t1) of the single driving mode is preferably to be set below or equal to a short circuit capacity of the MOSFET 21 under the condition of a voltage difference Vds between the drain and source of the MOSFET 21, in other words, the voltage difference between the main power supply VCC and the ground GND. The short circuit capacity is a physical amount in the unit of time. The short circuit capacity gets shorter as the voltage difference VCC−GND becomes larger; or alternatively, the short circuit capacity gets longer as the voltage difference VCC−GND becomes smaller. As the duration time of the single driving mode becomes longer, the tail current of the IGBT 22 can have smaller influence on the power consumption. Accordingly, the duration time of the single driving mode is preferably to be set longer based on the condition of having smaller or equal to the short circuit capacity.

Figure 3:
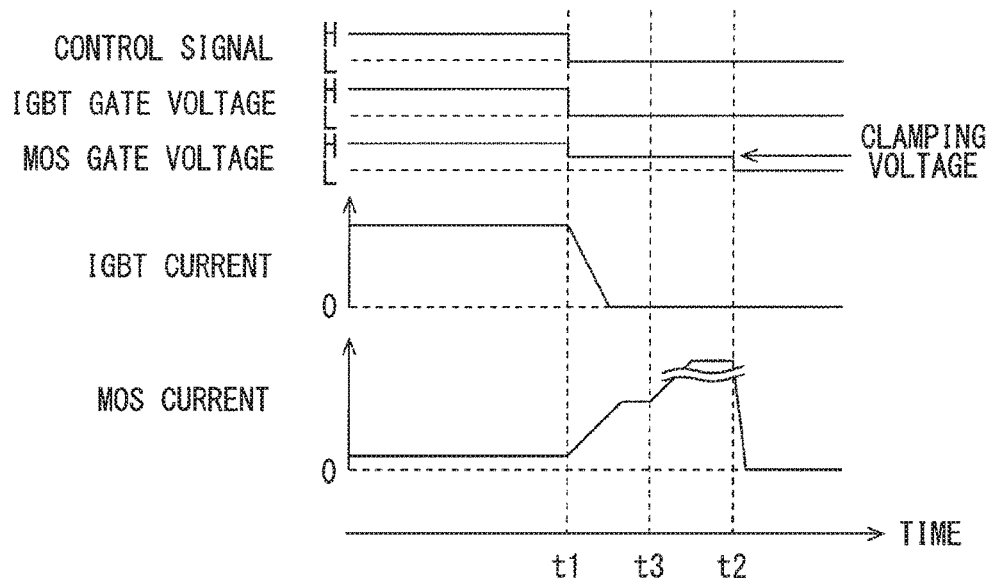
FIG. 3 is a timing chart that shows an operation of the driving apparatus in a situation where a short circuit occurs.

The following describes a situation in which the short circuit occurs in the load 30 when the switching element 20 is turned off with reference to FIG. 3. Since the operations of the controller 11, the driving circuit 12, the MOSFET 21 and the IGBT 22 are similar to the ones described with reference to FIG. 2, the detailed description is omitted.

As illustrated in FIG. 3, it is assumed that the short circuit occurs in the load 30 at time t3. The time t3 is the duration of the single driving mode. At the time t3, a short circuit occurs at the load 30 and the voltage of the main power supply VCC is directly supplied to the place between the drain and source of the MOSFET 21. Accordingly, the output current of the MOSFET 21, in other words, the drain current is at the overcurrent state.

In the conventional configuration, the gate voltage is not lowered to the clamping voltage at the single driving mode. Accordingly, when the short circuit occurs in the load 30, Vds is at the high level so that the MOSFET 21 is maintained at the on state. That is, the fault occurs in the MOSFET 21 due to the overcurrent. In contrast, in the single driving mode, the driving apparatus 10 according to the present embodiment controls Vgs of the MOSFET 21 to be lowered at the clamping voltage, which is lower than the gate voltage at the multi-control mode; therefore, the short-circuit currently can be easily controlled as compared to the conventional configuration. Thus, the loss due to short circuit current is inhibited and the short circuit capacity of the MOSFET is longer than heretofore.

Moreover, since the short circuit capacity can be elongated, a longer delay than heretofore can be made in a time from a moment of having a short circuit to the protection operation of the switching element 20. Accordingly, even when the generation of a short circuit is not detected immediately; or even when a device for detecting the output current of the MOSFET 21 is not provided, the shunt resistor 14 provided at the sense emitter terminal of the IGBT 22 can carry out the protection.

The protection operation of the switching element 20 may also be carried out in a situation when the current detected by the shunt resistor 14, which is connected to the sense emitter terminal of the IGBT 22, exceeds the threshold value when the switching element is turned on in the next occasion.

In a situation where the MOSFET 21 is configured with silicon carbide as the main component, with regard to the configuration in which a current detector is provided to the MOSFET 21, the element size of the MOSFET 21 becomes larger as compared to the configuration without the current detector, and the cost becomes higher. In contrast, if the driving apparatus 10 according to the present embodiment is used, the current detector is not required for the MOSFET 21 so that the size of the switching element 20 can be made smaller and then the manufacturing cost can also be reduced.

Second Embodiment

A driving apparatus 10 according to the present embodiment includes a gate voltage detector 15 (denoted as GD in FIG. 4) in addition to the driving apparatus according to the first embodiment. Since the configuration without the gate voltage detector 15 is similar to the one in the first embodiment, the detailed description is omitted.

The gate voltage detector 15 is connected to the gate electrode of the IGBT 22 corresponding to the second switching element. The gate detector 15 detects the gate voltage applied to the IGBT 22 from the second driving circuit 12b, and the value of the gate voltage is fed back to the controller 11.

The first embodiment describes an example in which the controller 11 sets the gate voltage of the MOSFET 21 as the clamping voltage as a trigger when the control signal is switched from the H-level to the L-level. However, the controller 11 according to the present embodiment decides a gate voltage at the single driving mode based on the gate voltage of the IGBT 22 detected by the gate voltage detector 15.

In particular, based on the condition where the gate voltage of the IGBT 22 is smaller than or equal to a predetermined voltage, the controller 11 may set the clamping circuit 13 to be effective and then may set the gate voltage applied to the MOSFET 21 at the clamping voltage.

For example, in a situation where the gate of the IGBT 22 is lowered to the clamping level for maintaining the off state of the IGBT 22, the drain current as the output current of the MOSFET 21 rises. Accordingly, when the controller 11 lowers the gate voltage of the MOSFET 21 until the clamping voltage, the short circuit capacity can be elongated and the switching loss caused by turning on or off the switching element 20 can also be reduced.

Other Embodiments

While the present disclosure has been described with reference to preferable embodiments thereof, it is to be understood that the disclosure is not limited to the above embodiments. The various combinations and configurations are also within the spirit and scope of the present disclosure.

Figure 5:
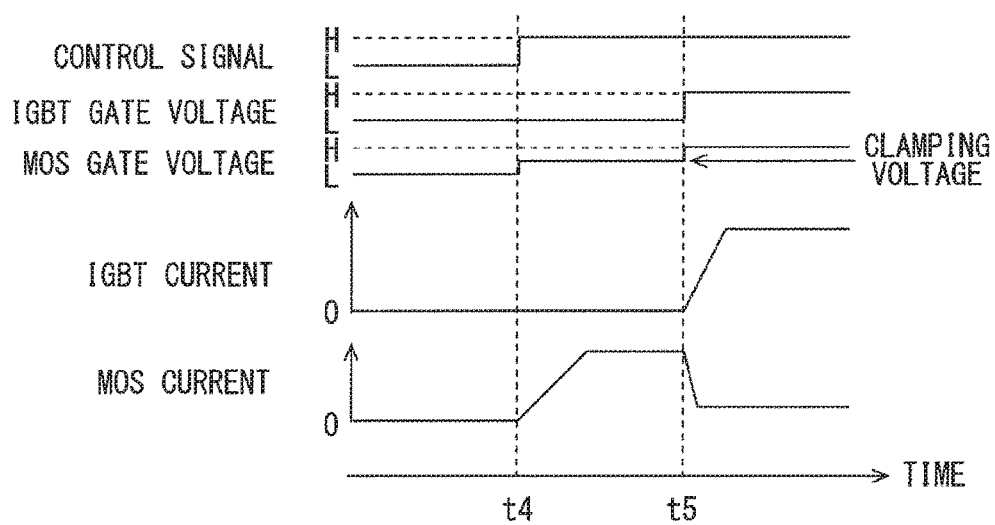
FIG. 5 is a circuitry diagram that shows a general configuration of a driving apparatus and a periphery apparatus of the driving apparatus according to other embodiment.

Each of the above embodiments describes mainly that the switching element 20 is turned off, the present disclosure is also applicable to the situation where the switching element 20 is turned on. For example, as shown in FIG. 5, when the command of turning on the switching element 20 is provided to the controller 11 at time t4, the controller 11 switches the control signal from the L-level to the H-level. The driving circuit 12b receives the control signal and applies the gate voltage to the gate electrode of the IGBT 22 at time t5 after the elapse of a delay time. On the other hands, the first driving circuit 12a receives the control signal, which is switched from the L-level to the H-level, and performs the gate voltage application to the MOSFET 21. In this situation, the gate voltage is set at the clamping voltage. The first driving circuit 12a maintains the clamping voltage from time t4 to time t5. Subsequently, at time t5, The IGBT 22 and the MOSFET 21 are fully turned off. In other words, the controller 11 turns on the switching element 20 by carrying out the single driving mode prior to the multi-driving mode when the switching element 20 is turned on.

Accordingly, when the switching element 20 is turned on, even when the short circuit occurs in the load 30, since the gate voltage of the MOSFET 21 to be turned on initially is limited to the clamping voltage, the output current flowing through the MOSFET 21 can be inhibited heretofore. Therefore, the short circuit capacity of the MOSFET 21 can be elongated so that it can be configured to enter the protection operation by detecting a short circuit before having a fault in the MOSFET 21.

Each of the above embodiments describes an example of using voltage to current conversion performed by the shunt resistor 14 as the current detector; however, it may not be restricted to the shunt resistor 14 as the value of the output current of the IGBT 22 as the second switching element can be detected.

Each of the above embodiments describes the driving apparatus 10 configured to drive two switching elements of the MOSFET 21 and the IGBT 22 as the switching element 20 in parallel; however, a driving apparatus configured to drive three or more elements in parallel can also be applied to the present disclosure. For example, in a case where the first switching element (for example, MOSFET 21), the second switching element (for example, IGBT 22) and the third switching element (for example, an IGBT 23 different from the IGBT 22) are driven in parallel, the driving apparatus 10 may synchronize the control signals to turn off the IGBT 22 and the IGBT 23 when the switching element 20 is turned off and drives the MOSFET 21 by maintaining at the clamping voltage within a predetermined period and then turn off the MOSFET 21.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A driving apparatus configured to drive a plurality of switching elements including a first switching element and a second switching element, each of the plurality of switching elements having a gate electrode, the driving apparatus comprising:
   a driving circuit configured to supply a voltage to the gate electrode; and
   a controller configured to control the plurality of switching elements to turn on or off, wherein:
   the controller includes a control mode having
      a multi-driving mode configured to drive both of the first switching element and the second switching element, and
      a single driving mode configured to drive only the first switching element; and
   the controller at the single driving mode sets a gate voltage to be applied to a gate electrode of the first switching element at a clamping voltage, which is smaller than the gate voltage of the first switching element at the multi-driving mode.

2. The driving apparatus according to claim 1, wherein the controller turns off the plurality of switching elements through the single driving mode having a predetermined time elapsed from the multi-driving mode when the plurality of switching elements are turned off.

3. The driving apparatus according to claim 2, wherein the predetermined time is set shorter than or equal to a short circuit capacity of the first switching element based on a voltage difference across output terminals of the first switching element.

4. The driving apparatus according to claim 1, wherein the controller turns on the first switching element by carrying out the single driving mode prior to the multi-driving mode when the plurality of switching elements are turned on.

5. The driving apparatus according to claim 1, further comprising:
   a current detector configured to detect an output current flowing through the second switching element,
   wherein the current detector is arranged at an output current path of the second switching element, which is one of a plurality of current paths correspondingly included in the plurality of switching elements.

6. The driving apparatus according to claim 1, wherein the gate voltage to be applied to the gate electrode of the first switching element is regarded as the first gate voltage,
   the driving apparatus further comprising:
   a gate voltage detector configured to detect a second gate voltage to be applied to a gate electrode of the second switching element, and
   wherein the controller sets the first gate voltage of the first switching element at the clamping voltage when a value of the second gate voltage detected by the gate voltage detector is smaller than or equal to a predetermined threshold value.

7. The driving apparatus according to claim 1, wherein:
   the first switching element is a MOSFET made of silicon carbide as a main component; and
   the second switching element is an IGBT made of silicon as a main component.

* * * * *